(12) United States Patent
Tanaka

(10) Patent No.: US 9,623,637 B2
(45) Date of Patent: Apr. 18, 2017

(54) SUPPORTED RESIN SUBSTRATE, METHOD FOR PRODUCING THE SAME, AND ELECTRONIC DEVICE INCLUDING RESIN SUBSTRATE

(71) Applicant: Panasonic Intellectual Property Management Co., Ltd., Osaka (JP)

(72) Inventor: Yuji Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 122 days.

(21) Appl. No.: 14/715,607

(22) Filed: May 19, 2015

(65) Prior Publication Data

US 2015/0344360 A1     Dec. 3, 2015

(30) Foreign Application Priority Data

May 29, 2014  (JP) ................. 2014-111327

(51) Int. Cl.
| | | |
|---|---|---|
| B32B 27/08 | (2006.01) | |
| C03C 17/42 | (2006.01) | |
| C03C 17/245 | (2006.01) | |
| B32B 7/12 | (2006.01) | |
| B32B 27/28 | (2006.01) | |
| B32B 27/30 | (2006.01) | |
| B32B 27/36 | (2006.01) | |
| B32B 27/42 | (2006.01) | |
| C23C 14/08 | (2006.01) | |
| H05K 3/00 | (2006.01) | |

(52) U.S. Cl.
CPC ............ *B32B 27/08* (2013.01); *B32B 7/12* (2013.01); *B32B 27/281* (2013.01); *B32B 27/285* (2013.01); *B32B 27/30* (2013.01); *B32B 27/36* (2013.01); *B32B 27/42* (2013.01); *C03C 17/245* (2013.01); *C03C 17/42* (2013.01); *C23C 14/086* (2013.01); *B32B 2255/10* (2013.01); *B32B 2255/20* (2013.01); *B32B 2307/748* (2013.01); *B32B 2457/00* (2013.01); *H05K 3/007* (2013.01); *H05K 2203/016* (2013.01)

(58) Field of Classification Search
CPC ..... C03C 17/42; C03C 17/245; C23C 14/086; B32B 27/285; B32B 27/08; B32B 27/281; B32B 27/36; B32B 27/30; B32B 27/42; B32B 7/12; B32B 2255/10; B32B 2255/20; B32B 2457/00; B32B 2307/748; H05K 3/007; H05K 2203/016
See application file for complete search history.

(56) References Cited

U.S. PATENT DOCUMENTS

| | | |
|---|---|---|
| 2004/0129960 A1 | 7/2004 | Maruyama et al. |
| 2007/0091062 A1 | 4/2007 | French et al. |
| 2011/0223345 A1 | 9/2011 | Tomiyama et al. |

FOREIGN PATENT DOCUMENTS

| | | |
|---|---|---|
| JP | 5-315630 | 11/1993 |
| JP | 2004-214281 | 7/2004 |
| JP | 2007-512568 | 5/2007 |
| JP | 2007-169304 | 7/2007 |
| WO | 2009/157203 | 12/2009 |
| WO | 2012/060199 | 5/2012 |
| WO | 2014/050933 | 4/2014 |

*Primary Examiner* — Robert Jones, Jr.
(74) *Attorney, Agent, or Firm* — Greenblum & Bernstein, P.L.C.

(57) ABSTRACT

There is provided a supported resin substrate including a supporting substrate, a release layer arranged on the supporting substrate, the release layer containing a metal oxide, and a resin substrate arranged on the release layer, the resin substrate including a first surface region opposite the release layer and a second surface region in onto t with the release layer, in which the resin substrate consists essentially of a resin material having a C=O bond, and the proportion of the C=O bond present in the second surface region of the resin substrate is lower than the proportion of the C=O bond present in the first surface region of the resin substrate.

16 Claims, 4 Drawing Sheets

|  | RELEASE LAYER | ATMOSPHERE DURING DEPOSITION OF RELEASE LAYER | PEEL STRENGTH [N/20 mm] |
|---|---|---|---|
| EXAMPLE 1 | InZnO | Ar100% | 7.0 |
| COMPARATIVE EXAMPLE 1 | NOT USED | — | 10.6 |
| COMPARATIVE EXAMPLE 2 | InZnO | Ar90%/$O_2$10% | 16.3 |

| | (PROPORTION OF C=O BOND IN SECOND SURFACE REGION) / (PROPORTION OF C=O BOND IN FIRST SURFACE REGION) |
|---|---|
| EXAMPLE 1 | 0.84 |
| COMPARATIVE EXAMPLE 1 | 1.01 |
| COMPARATIVE EXAMPLE 2 | 1.02 |

101

SUPPORTED RESIN SUBSTRATE, METHOD FOR PRODUCING THE SAME, AND ELECTRONIC DEVICE INCLUDING RESIN SUBSTRATE

BACKGROUND

1. Technical Field

The present disclosure relates to a supported resin substrate, a method for producing the supported resin substrate, and an electronic device including the resin substrate.

2. Description of the Related Art

Recent prevalence of mobile information terminals and so forth have strongly required reductions in the thickness and weight of electronic devices, such as displays, mounted on such terminals. In addition to these demands, impact resistance and flexibility have also recently been required. The research and development of the use of flexible resin substrates, instead of glass substrates ire the related art, as substrates on which electronic elements included in electronic devices are mounted has been increasing. Japanese Unexamined Patent Application Publication (Translation of PCT Application) No. 2007-512568 and Japanese Unexamined Patent Application Publication No. 2007-169304 are examples of related art.

SUMMARY

In one general aspect, the techniques disclosed here feature a supported resin substrate including a supporting substrate, a release layer arranged on the supporting substrate, the release layer containing a metal oxide, and a resin substrate arranged on the release layer, the resin substrate including a first surface region opposite the release layer and a second surface region in contact with the release layer, in which the resin substrate consists essentially of a resin material having a C=O bond, and the proportion of the C=O bond present in the second surface region of the resin substrate is lower than the proportion of the C=O bond present in the first surface region of the resin substrate.

In the supported resin substrate according to the one aspect of the techniques disclosed here, the release layer containing the metal oxide is arranged between the supporting substrate and the resin substrate. In the resin substrate consisting essentially of the material, such as polyimide, having the C=O bond, the proportion of the C=O bond present in a region of the resin substrate contact with the release layer is lower than the proportion of the C=O bond present in a region of the resin substrate opposite the release layer. Thus, the adhesive strength between the resin substrate and the release layer on the supporting substrate is rawer than the adhesive strength between the supporting substrate and the resin substrate when the resin substrate is directly arranged on the supporting substrate without arranging the release layer.

In the supported resin substrate according to the one aspect of the techniques disclosed here, the adhesive strength between the supporting substrate and the resin substrate reduced in light of the C=O bond of the resin substrate.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
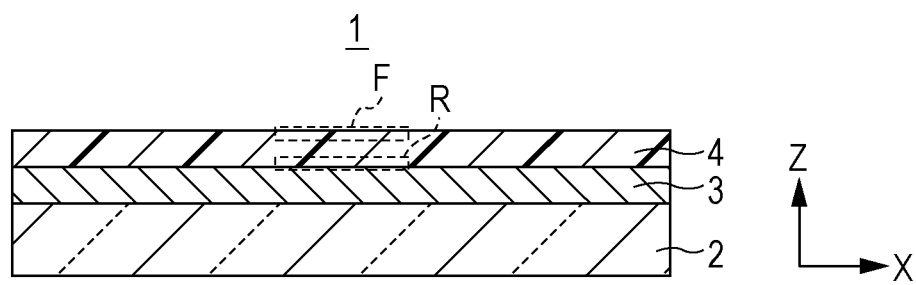
FIG. 1 is a cross-sectional view of a supported resin substrate according to a first embodiment.

When an electronic element is formed on a resin substrate, the resin substrate serving as a base is distorted, causing difficulty in ensuring adequate flatness. Thus, it is not possible to employ a known method for producing an electronic element with a glass substrate.

To employ a known method for producing an electronic element with a glass substrate, a method is studied in which a resin substrate is formed on a supporting substrate composed of a hard material, such as glass, an electronic element is formed on the resin substrate, and the resin substrate on which the electronic element is formed is peeled from the supporting substrate in the final step.

As a resin material for a resin substrate, for example, polyimide, polyimide, and polycarbonate are commonly used. These resin materials commonly have C=O bonds. A resin substrate is formed on a supporting substrate, and then an electronic element is formed on the resin substrate. When the resin substrate on which the electronic element is formed is separated from the supporting substrate, there is a problem of high adhesive strength between the supporting substrate and the resin substrate. When the peeling is forcibly performed by a mechanical method, disadvantageously, the resin substrate is broken or the electronic element is damaged. The C=O bonds are seemingly directed to a direction perpendicular to the main chain of the polymer included in the resin and thus are presumed to be one of the parameters that affect the adhesive strength between the supporting substrate and the resin substrate.

The present disclosure provides a supported resin substrate without causing the foregoing problem even by a mechanical peeling method because the adhesive strength between the supporting substrate and the resin substrate is reduced in light of the C=O bonds of the resin substrate.

An aspect of the present disclosure provides a supported resin substrate including a supporting substrate, a release layer arranged on the supporting substrate, the release layer containing a metal oxide, and a resin substrate arranged on the release layer, the resin substrate including a first surface region opposite the release layer and a second surface region in contact with the release layer, in which the resin substrate consists essentially of a resin material having a C=O bond, and the proportion of the C=O bond present in the second surface region of the resin substrate is lower than the proportion of the C=O bond present in the first surface region of the resin substrate.

In another aspect of the present disclosure, the ratio of the proportion of the C=O bond present in the second surface region to the proportion of the C=O bond present in the first surface region may be 0.95 or less. The resin substrate may contain impurities other than the resin material.

In another aspect of the present disclosure, the ratio of the proportion of the C=O bond present in the second surface region to the proportion of the C=O bond present in the first surface region may be 0.85 or less.

In another aspect of the present disclosure,the metal oxide may contain at least one selected from the group consisting of indium zinc oxide, zinc oxide, and aluminum oxide.

In another aspect of the present disclosure, the release layer containing the metal oxide may be in an oxygen deficient state.

An aspect of the present disclosure provides a method for producing a supported resin substrate, the method including preparing a supporting substrate, forming a release layer on the supporting substrate, the release layer containing a metal oxide, and applying a resin material onto the release layer to form a resin substrate including a first surface region opposite the release layer and a second surface region in contact with the release layer, in which the resin material has a C=O bond, and the proportion of the C=O bond in the second surface region of the resin substrate is lower than the proportion of the C=O bond present in the first surface region of the resin substrate.

In another aspect of the present disclosure, the ratio of the proportion of the C=O bond present in the second surface region to the proportion of the C=O bond present in the first surface region may be 0.95 or less.

In another aspect of the present disclosure, the ratio of the proportion of the C=O bond present in the second surface region to the proportion of the C=O bond present in the first surface region may be 0.85 or less.

In another aspect of the present disclosure, the metal oxide may contain at least one selected from the group consisting of indium zinc oxide, zinc oxide, and aluminum oxide.

In another aspect of the present disclosure, the release layer containing the metal oxide may be formed in an inert gas or a reducing gas.

An aspect of the present disclosure provides a method for producing an electronic device, the method including forming an electronic element on a supported resin substrate produced by any one of the methods described above, and mechanically peeling the resin substrate on which the electronic element is formed from the release layer formed on the supporting substrate.

An aspect of the present disclosure provides an electronic device including a resin substrate having a first surface region and a second surface region opposite the first surface region, and an electronic element in contact with the first surface region of the resin substrate, in which the resin substrate consists essentially of a resin material having a C=O bond, and the proportion of the C=O bond present in the second surface region of the resin substrate is lower than the proportion of the C=O bond present in the first surface region of the resin substrate.

In another aspect of the present disclosure, the ratio of the proportion of the C=O bond present in the second surface region to the proportion of the C=O bond present in the first surface region may be 0.95 or less.

In another aspect of the present disclosure,the ratio of the proportion of the C=O bond present in the second surface region to the proportion of the C=O bond present in the first surface region may be 0.85 or less.

In another aspect of the present disclosure, the electronic element may be an organic electroluminescent element.

In another aspect of the present disclosure, the proportion of the C=O bond in the first surface region is defined by the ratio of the area of a spectrum derived from the C=O bond in the first surface region to the area of a C1s spectrum of the first surface region, the spectrum derived from the C=O bond in the first surface region and the C1s spectrum of the first surface region being measured by X-ray photoelectron spectroscopy, and the proportion of the C=O bond in the second surface region is defined by the ratio of the area of a spectrum derived from the C=O bond in the second surface region to the area of a C1s spectrum of the second surface region, the spectrum derived from the C=O bond in the second surface region and the C1s spectrum of the second surface region being measured by X-ray photoelectron spectroscopy.

Embodiments of the present disclosure will be described in detail below with reference to the attached drawings.

First Embodiment (1) Structure of Resin Substrate 1 Provided with Supporting Substrate FIG. 1 is a cross-sectional view of a resin substrate 1 provided with a supporting substrate.

The resin substrate 1 provided with the supporting substrate includes a supporting substrate 2, a release layer 3 arranged on the supporting substrate 2, and a resin substrate 4 arranged on the release layer 3.

The supporting substrate 2 is preferably composed of a material which has high flatness and which is less likely to deform because the flexible resin substrate 4 is arranged above the supporting substrate 2. Examples of a material that may be used for the supporting substrate 2 include alkali-free glass, soda glass, non-fluorescent glass, phosphate-based glass, borate-based glass, and silica. In addition, acrylic-based resins, styrene-based resins, polycarbonate-based resins, epoxy-based resins, polyethylene-based resins, polyester-based resins, silicone-based resins, alumina, and so forth may also be used.

The release layer 3 is arranged on the supporting substrate 2. The release layer 3 is preferably composed of a material having low adhesive strength to the resin substrate 4 arranged thereon. Such a material for the release layer 3 contains a metal oxide. Examples of the metal oxide include indium zinc oxide, zinc oxide, aluminum oxide, indium oxide, magnesium oxide, copper oxide, lithium oxide, potassium oxide, sodium oxide, and calcium oxide.

The resin substrate 4 is arranged on the release layer 3. The resin substrate 4 consists essentially of a resin, such as polyimide, having a C=O bond (double bond between carbon, C, and oxygen, O). The resin substrate 4 has a first surface region F and a second surface region R, the first surface region F being disposed opposite the second surface region R that is in contact with the release layer 3. The proportion of the C=O bonds present in the second surface region R is lower than the proportion of the C=O bonds present in the first surface region F. A method for allowing the first surface region F and the second surface region R to have different proportions of the C=O bonds will be described in detail below. In this specification, the proportion of the C=O bonds is measured by X-ray photoelectron spectroscopy (XPS). Thus, each of the first surface region F and the second surface region R indicates a region ranging from a depth of several nanometers from a corresponding one of the outermost surfaces to a depth of about 10 nm. Examples of a material that may be used for the resin substrate 4 include, in addition to polyimide, polyimide, polyimide imide, polyester, polycarbonate, polymethylmethacrylate, polyurea, polyether ketone, polyether ether ketone, polyether imide, and polyarylate. The resin substrate 4 may have a layered structure composed of two or more of these materials.

(2) Method for Producing Resin Substrate 1 Provided with Supporting Substrate

Figure 2A:
FIG. 2A is a cross-sectional view of a state in which a supporting substrate is prepared.
Figure 2B:
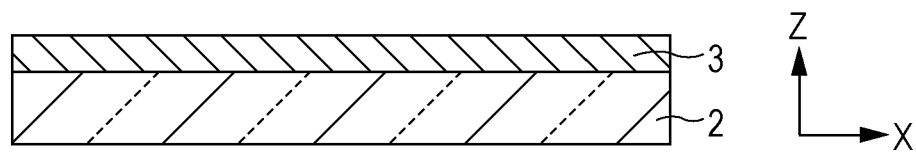
FIG. 2B is a cross-sectional view of a state in which a release layer is arranged on the supporting substrate.
Figure 2C:
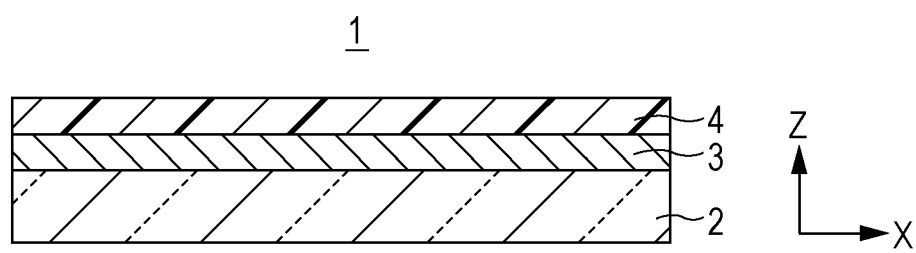
FIG. 2C is a cross-sectional view of a state in which a resin substrate is arranged on the release layer.

FIGS. 2A to 2C illustrate a method for producing the resin substrate 1 provided with the supporting substrate.

As illustrated in FIG. 2A, the supporting substrate 2 is prepared. As illustrated in FIG. 2B, the release layer 3 is formed on the supporting substrate 2. In this case, a metal oxide is deposited by, for example, a sputtering method at an oxygen flow rate of zero with argon gas flowing. As a result, the metal oxide is in an oxygen deficient state. In the case where the metal oxide is in the oxygen deficient state, the adhesive strength between the release layer 3 and the resin substrate 4 to be formed on the metal oxide is reduced. As illustrated in FIG. 2C, the resin substrate 4 is formed on the release layer 3. Specifically, after a solution of a polyamic acid serving as a precursor a polyimide is applied and heated, a solvent is evaporated by heating. At this time, the polyamic acid is imidized to prepare a polyimide.

(3) Experimental Result

To conduct experiments described below, three resin substrates provided with supporting substrates (Example 1 and Comparative Examples 1 and 2) were prepared. The resin substrates were composed of a polyimide.

Example 1

An alkali-free glass substrate (Eagle XG, registered trademark of Corning Inc.) was prepared as a supporting substrate. A release layer is deposited to a thickness of 200 nm on the supporting substrate by a DC magnetron sputtering method with a target composed of indium zinc oxide (In-ZnO) in a 100% Ar atmosphere. A polyamic acid (U-Varnish A, manufactured by Ube Industries, Ltd.) was applied onto the release layer by spin coating and then baked at 400° C. in a nitrogen atmosphere to effect imidization, thereby forming a 15-μm-thick resin substrate composed of a polyimide. According to the foregoing method, the supported resin substrate of Example 1 was provided.

Comparative Example 1

An alkali-free glass substrate (Eagle XG, registered trademark of Corning Inc.) was prepared as a supporting substrate. A polyamic acid (U-Varnish A, manufactured by Ube Industries, Ltd.) was directly applied onto the supporting substrate (glass) by spin coating and then baked at 400° C. in a nitrogen atmosphere to effect imidization, thereby forming a 15-μm-thick resin substrate composed of a polyimide. According to the foregoing method, the supported resin substrate of Comparative Example 1 was provided.

Comparative Example 2

An alkali-free glass substrate (Eagle XG, registered trademark of Corning Inc.) was prepared as a supporting substrate. A release layer is deposited to a thickness of 200 nm on the supporting substrate by a DC magnetron sputtering method with a target composed of indium zinc oxide (In-ZnO) in an Ar/O$_2$ (90%/10%) atmosphere. A polyamic acid (U-Varnish A, manufactured by Ube Industries, Ltd.) was applied onto the release layer by spin coating and then baked at 400° C. in a nitrogen atmosphere to effect imidization, thereby forming a 15-μm-thick resin substrate composed of a polyimide. According to the foregoing method, the supported resin substrate of Comparative Example 2 was provided.

Measurement of Peel Strength

Figures 3, 4:
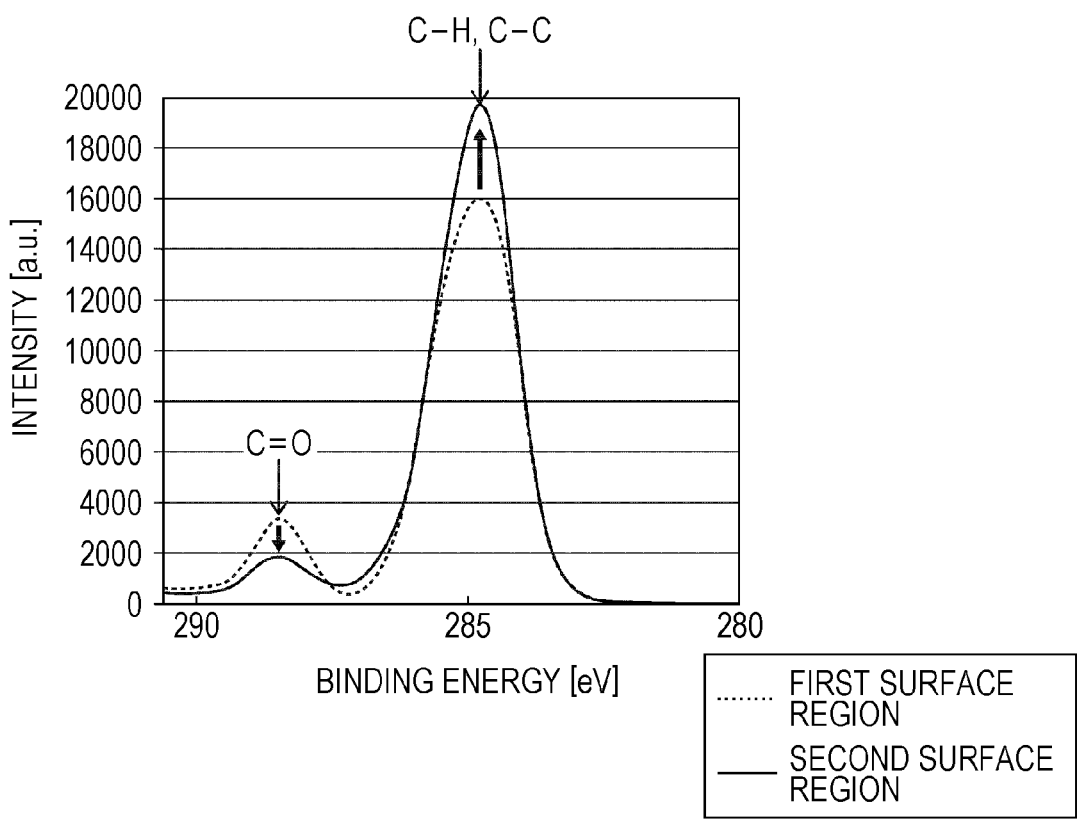
FIG. 3 illustrates a material of release layers, atmospheres during the deposition of the release layers, and the peel strength in Example 1 and Comparative Examples 1 and 2.
FIG. 4 is a graph illustrating the XPS measurement results (narrow band spectra of C1s) of a first surface region and a second surface region of a resin substrate in Example 1.

Each of the foregoing three resin substrates provided with the supporting substrates was subjected to a peel strength test. The peel strength test was performed according to JIS K6854. A 90° peel test, in which peeling is performed in a direction perpendicular to the substrate, was performed. FIG. 3 illustrates the measurement results of the peel strength. The peel strength in Example 1 was about 30% higher than that in Comparative Example 1 in which a release layer was not arranged. Despite the fact that the release layer was arranged in Comparative Example 2, the peel strength in Comparative Example 2 was higher than that in Comparative Example 1 in which a release layer was not arranged. Regardless of the arrangement of the same release layers composed of the indium zinc oxide, the peel strength in Example 1 is lower than that in Comparative Example 1, and the peel strength in Comparative Example 2 is higher than that in Comparative Example 1. The results are seemingly associated with the deposition conditions of the release layers. The deposition conditions include different O$_2$ concentrations in the atmospheres during the sputtering. The atmosphere during the sputtering in Example 1 is 100% Ar and does not contain oxygen. The atmosphere during the sputtering in Comparative Example 2 is the ArO$_2$ (90%/10%) atmosphere and contains about 10% oxygen. In other words, the release layer in Example 1 seems to be in an oxygen deficient state. The release layer in Comparative Example 2 seems to be in an oxygen-rich state, compared with Example 1.

XPS Measurement of Resin Substrate

The resin substrate was peeled from the supported resin substrate in Example 1. To study the bonding states of elements included in the first surface region and the second surface region of the peeled resin substrate, XPS measurement was performed. In XPS, it is generally possible to identify the bonding states of constituent elements in a region ranging from a depth of several nanometers from a surface to a depth of about 10 nm. The resin substrate is composed of the polyimide represented by the chemical formula 1. Thus, the constituent elements are C, O, N, and H. Hydrogen H is not detected by XPS.

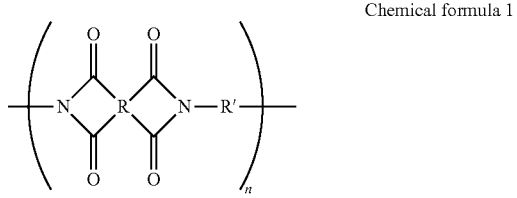

Chemical formula 1

Figures 5, 6:
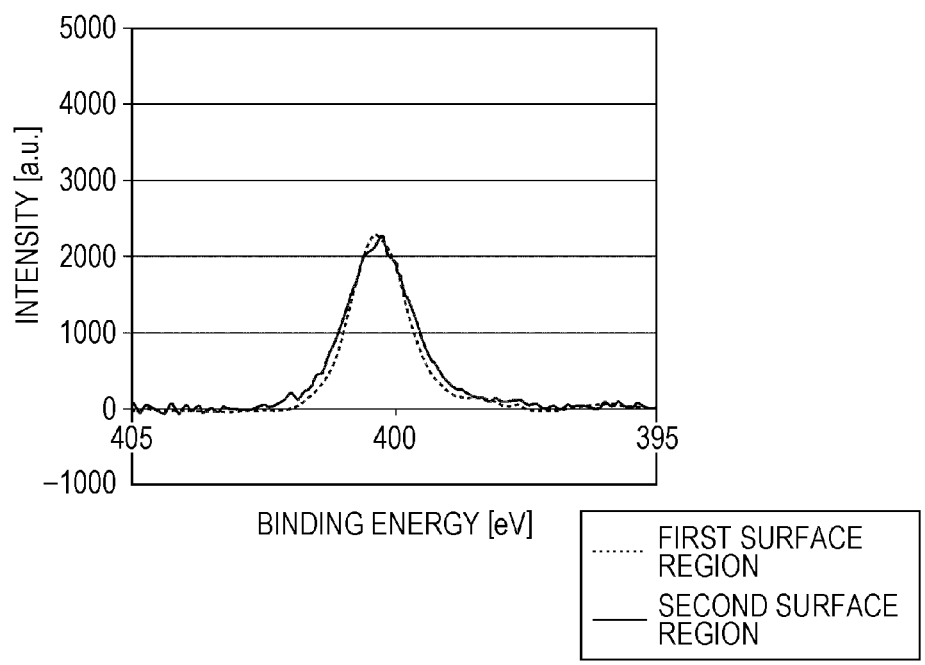
FIG. 5 is a graph illustrating the XPS measurement results (narrow band spectra of N1s) of the first surface region and the second surface region of the resin substrate in Example 1.
FIG. 6 illustrates the calculation results of the ratios of the proportions of the C=O bonds present in the second surface regions of the resin substrates to the proportions of the C=O bonds present in the first surface regions of the resin substrates in Example 1 and Comparative Examples and 2.

FIGS. 4 and 5 illustrate the measurement results of narrow band spectra of C1s and N1s, respectively. The spectra of C1s derived from the C=O bonds are exhibited at about 288 eV. The peaks at about 288 eV are assigned to C=O bonds in the imide group of the polyimide. The peaks at about 285 eV are mainly assigned to C—H and C—C bonds. FIG. 4 demonstrates that the proportion of the C=O bonds present in the second surface region is lower than that in the first surface region. The proportion of the C—H (C—C) bonds in the second surface region is higher than that in the first surface region.

The peaks N1s in FIG. 5 originate from nitrogen atoms on the imide rings of the polyimide and are assigned to N—C bonds. The peak position and the intensity in the first surface region are comparable to those in the second surface region, and there is no difference as observed in C1s. Thus, it is a good guess that nitrogen element is less likely to contribute to the peel strength of the resin substrate.

In the resin substrate in Example 1, in the second surface region in contact with the release layer, the rate of decrease in peak intensity at about 288 eV is larger than the rate of increase in peak intensity at about 285 eV (see FIG. 4), compared with the first surface region. Thus, the C=O bonds seemingly dominate the effect on the peel strength of the resin substrate.

The first surface region and the second surface region of the peeled resin substrate of each of Comparative Examples 1 and 2 were subjected to XPS measurement as in Example 1. Here, the ratio of the area of a spectrum band (287.2 eV to 289.5 eV) which exhibits a peak at about 288 eV and which is derived from the C=O bonds to the area of a C1s spectrum (282.0 eV to 289.5 eV) is defined as the proportion of the C=O bonds. FIG. 6 illustrates the calculation results of the ratios of the proportions of the C=O bonds present in the second surface regions to the proportions of the C=O bonds present in the first surface regions. As is clear from FIG. 6, in each of Comparative Examples 1 and 2, the value of the ratio is substantially 1, and the value of the proportion of the C=O bonds present in the first surface region is substantially equal to that in the second surface region. In contrast, in Example 1, the ratio is 0.84, and the value of the proportion of the C=O bonds present in the second surface region is lower than that in the first surface region. Thus, the decreased value of the proportion of the C=O bonds present in the second surface region is seemingly associated with the reduction in the peel strength of the resin substrate.

Discussion

The release layer in Example 1 is seemingly in an oxygen deficient state because of the difference in $O_2$ atmosphere during the sputtering in Example 1 and Comparative Example 2. The XPS measurement results demonstrated that the C=O bonds present in the second surface region of the resin substrate (in contact with the release layer 3) in Example 1 are reduced, compared with the first surface region. A combination of the two facts suggests the following: The metal oxide in the oxygen deficient state contains metal atoms with coordination sites deficient in oxygen atoms. The metal atoms have reducing ability and reduce the polyimide in the vicinity of an adhesive interface with the release layer to allow a C=O bond in the imide group to be reduced into a C—H bond. The adhesive strength between the release layer composed of the metal oxide and the resin substrate is seemingly attributed to the chemical interactions between hydroxy groups (OH groups) on a surface of the metal oxide and carbonyl groups (C=O bonds) in the resin substrate. One of the chemical interactions is the hydrogen bonds between hydrogen atoms of the hydroxy groups and oxygen atoms of the carbonyl groups. The other is the formation of ester bonds by the reaction of the hydroxy groups and the carbonyl groups. In the case where the C=O bonds present in the resin substrate are reduced into the C—H bonds by the oxygen-deficient metal oxide, the foregoing chemical interactions do not occur. The inventors presume that the adhesive strength is reduced by the foregoing mechanism.

Let us explain what ratio of the proportion of the C=O bonds present in the second surface region to the proportion of the C=O bonds present in the first surface region is quantitatively required to achieve a sufficient reduction in peel strength. It should be noted that in discussion here, the fact that the resin substrate is composed of a known resin material (polyimide in the first embodiment) is a prerequisite. The proportion of the C=O bonds present in the second surface region of the resin substrate in the first embodiment is required to be lower than at least the proportion of the C=O bonds present in the second surface region in Comparative Example 1 as in the related art. The proportion of the C=O bonds present in the first surface region of the resin substrate in the first embodiment is equal to the proportion of the C=O bonds present in the first surface region in Comparative Example 1. In fact, the results of XPS measurement of the first surface regions of Example 1 and Comparative Example 1 revealed that the spectral shapes were substantially identical to each other. The reason for this is presumably that both first surface regions are located at the interface with air and have the same surface state. Referring to FIG. 6, in Comparative Example 1, the proportion of the C=O bonds present in the first surface region was substantially the same as that in the second surface region. Thus, the proportion of the C=O bonds present in the first surface region of Example 1 should be equal to the proportion of the C=O bonds present in the second surface region of Comparative Example 1. Hence, the proportion of the C=O bonds present in the second surface region of the resin substrate in the first embodiment is required to be lower than at least the proportion of the C=O bonds present in the first surface region of the same resin substrate in the first embodiment. Considering measurement error in XPS, when the ratio of the proportion of the C=O bonds present in the second surface region to the proportion of the C=O bonds present in the first surface region is at least 0.95 or less, there may be a significant difference in the reduction in peel strength. As illustrated in Example 1 of FIG. 6, when the ratio of the proportion of the C=O bonds present in the second surface region to the proportion of the C=O bonds present in the first surface region is 0.85 or less, a significant reduction in peel strength is observed from experimental data. In summary, when the proportion of the C=O bonds present in the second surface region of the resin substrate is lower than the proportion of the C=O bonds present in the first surface region of the same resin substrate, the peel strength, i.e., adhesive strength, between the supporting substrate and the resin substrate is reduced. As a result of the reduction in adhesive strength, known materials, such as glass materials for the supporting substrate, and polyimide, polyamide, and polycarbonate for the resin substrate, may be used. Even when these materials are used, the occurrence of problems, such as the breakage of the resin substrate at the time of peeling and damage to an electronic element is suppressed. Preferably, when the ratio of the proportion of the C=O bonds present in the second surface region of the resin substrate to the proportion of the C=O bonds present in the first surface region of the same resin substrate is 0.95 or less, the peel strength, i.e., adhesive strength, is further reduced. More preferably, when the ratio of the proportion of the C=O bonds present in the second surface region of the resin substrate to the proportion of the C=O bonds present in the first surface region of the same resin substrate is 0.85 or less, the peel strength, i.e., adhesive strength, is still further reduced.

Second Embodiment

In this embodiment, a method for producing an organic EL device as an example of an electronic device including the resin substrate 1 provided with the supporting substrate described in the first embodiment and the structure of the organic EL device will be described below with reference to FIG. 7.

The resin substrate 1 provided with the supporting substrate is produced as in the first embodiment.

Figure 7A:
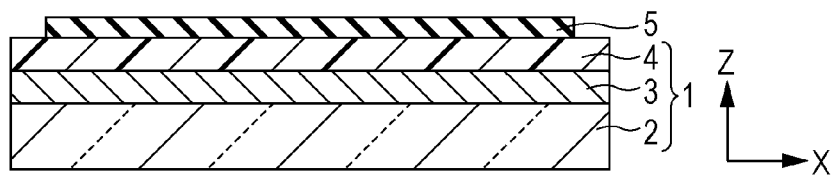
FIG. 7A is a cross-sectional view of a state in which a barrier layer is arranged on the supported resin substrate.

As illustrated in FIG. 7A, a barrier layer 5 is formed on the resin substrate 4 and patterned to an appropriate size. The barrier layer 5 is mainly arranged in order to prevent oxygen and water from the atmosphere from permeating the resin substrate 4 and reaching an organic EL element. The barrier layer 5 also serves to inhibit the diffusion of water and impurities from the resin substrate 4. Examples of a material that may be used for the barrier layer 5 include silicon oxide, silicon nitride, silicon oxynitride, aluminum oxide, aluminum oxynitride, and alkoxyalkylsilane. The barrier layer 5 may be formed of a thin film composed of one selected from these materials. Alternatively, the barrier layer 5 may be formed of alternately stacked thin films composed of two or more types of these materials. Examples of a method for forming the barrier layer 5 include a chemical vapor deposition (CVD) method, a metal-organic chemical vapor deposition (MOCVD) method, a vacuum evaporation method, a sputtering method, an atomic layer deposition (ALD) method, a molecular layer deposition (MLD) method, and combinations thereof.

Figure 7B:
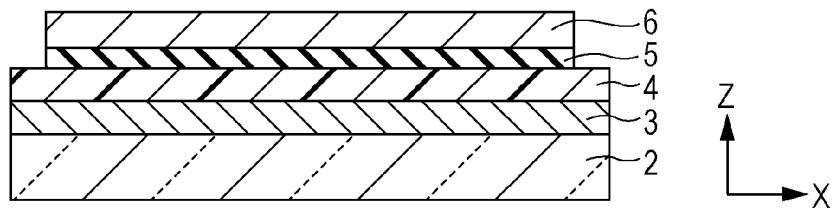
FIG. 7B is a cross-sectional view of a state in which an organic electroluminescent element (organic EL element) is arranged on the baffle layer.

As illustrated in FIG. 7B, an organic EL element 6 is formed on the barrier layer 5. The organic EL element 6 includes a thin-film transistor and various electrode lines. An organic EL layer in the organic EL element 6 includes an anode, a light-emitting layer, and a cathode and, if necessary, may include a charge injection layer or a charge transport layer.

Figure 7C:
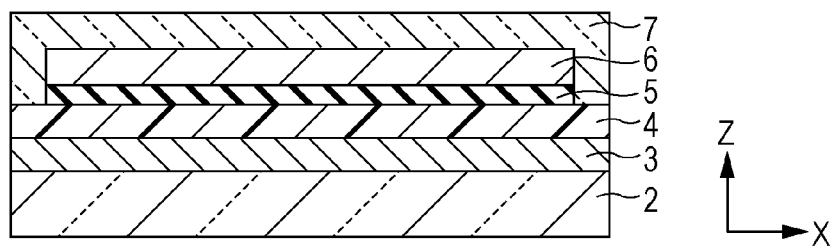
FIG. 7C is a cross-sectional view of a state in which a sealing member is arranged on the resin substrate and covers the barrier layer and the organic EL element.

As illustrated in FIG. 7C, a sealing member 7 is formed on the resin substrate 4 so as to cover the barrier layer 5 and the organic EL element 6. The sealing member 7 is arranged in order to increase the strength of the organic EL device and prevent oxygen and water from reaching the organic EL element 6. The sealing member 7 is preferably composed of a transparent material that transmits visible light. Examples of the transparent material include transparent plastic materials, such as polyesters, such as polyethylene terephthalate and polyethylene naphthalate, cyclic polyolefins, and polycarbonates. A touch panel or circularly polarizing plate may be arranged on the sealing member 7, as needed. Furthermore, another barrier layer may be arranged between the sealing member 7 and the organic EL element 6. In the second embodiment, the electronic element includes the barrier layer 5, the organic EL element 6, and the sealing member 7.

Figure 7D:
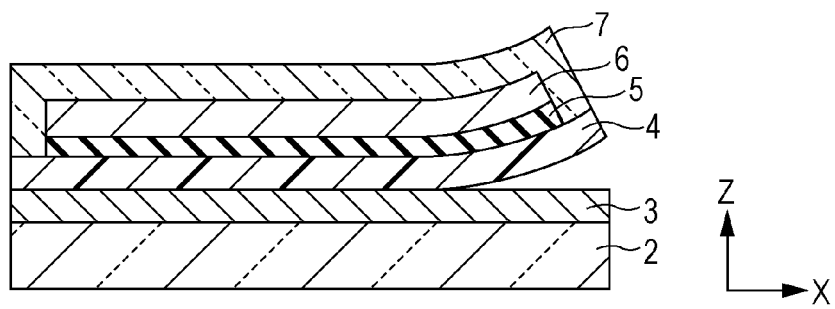
FIG. 7D is a cross-sectional view of a state in which the resin substrate s peeled from the release layer.

As illustrated in FIG. 7D, peeling is performed between the release layer 3 and the resin substrate 4. The peeling is mechanically performed by hand, with a roll-shaped winding machine, or the like. The adhesive strength between the release layer 3 and the resin substrate 4 is low, so the device is not damaged by a load required for the peeling.

Figure 7E:
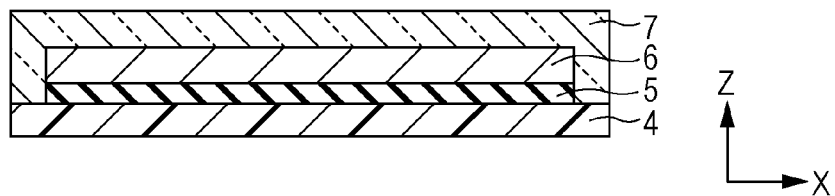
FIG. 7E is a cross-sectional view of a state in which an organic EL device is completed.

In this way, an organic EL device 101 having flexibility is completed as illustrated in FIG. 7E. The organic EL device 101 is a self-luminous device and thus has high visibility in addition to the flexibility. Furthermore, the organic EL device 101 is a solid device and thus has excellent impact resistance.

Additional Matter (1) In each of the foregoing embodiments, while the metal oxide-containing release layer is formed on the supporting substrate in the 100% Ar atmosphere, the atmosphere is not limited to Ar. The metal oxide-containing release layer may be formed in an inert gas or a reducing gas. Examples of the inert gas include, in addition to Ar, nitrogen and neon. Examples of the reducing gas include hydrogen, carbon monoxide, nitric oxide, and sulfur dioxide.

(2) In the first embodiment, the release layer is mainly composed of the polyimide. Known examples of a material for a layer that reduces adhesive strength include release agents, such as silicone resins and fluorocarbon resins, and silane coupling agents having fluorine-containing functional groups. In the case where such a material is used for the release layer, however, a solution containing the resin material has low wettability at the time of application, thereby failing to achieve good flatness of the resin substrate.

(3) In the foregoing embodiment, while the organic EL device including the organic EL element is produced as an electronic device, the present disclosure is not limited thereto. Non-limiting examples of the electronic element included in the electronic device may include thin film transistors (TFTs), liquid crystal display elements, light emitting diodes (LEDs), electronic paper, touch panels, solar cells, various sensors, large-scale integrated circuits (LSI circuits, and integrated circuits (ICs).

(4) In the supported resin substrate according to the present disclosure, the production method thereof, and the electronic device including the resin substrate, they may have configurations in which parts of the configurations in the embodiments are appropriately combined together. The materials, values, and so forth described in the embodiments are intended only as preferred examples, and the present disclosure is not limited thereto. The configurations may be appropriately changed without departing from the technical scope of the present disclosure. The present disclosure is widely used for resin substrates provided with supporting substrates, production methods therefor, and electronic devices including the resin substrates.

The present disclosure is widely applicable to flexible mobile Information terminals and so forth.

What is claimed is:
1. A supported resin substrate, comprising:
  a supporting substrate;
  a release layer arranged on the supporting substrate, the release layer containing a metal oxide; and a resin substrate arranged on the release layer, the resin substrate including a first surface region opposite the release layer and a second surface region in contact with the release layer, wherein the resin substrate consists essentially of a resin material having a C=O bond, and a proportion of the C=O bond present in the second surface region of the resin substrate is lower than a proportion of the C=O bond present in the first surface region of the resin substrate.

2. The supported resin substrate according to claim 1, wherein a ratio of the proportion of the C=O bond present in the second surface region to the proportion of the C=O bond present in the first surface region is 0.95 or less.

3. The supported resin substrate according to claim 2, wherein the ratio of the proportion of the C=O bond present in the second surface region to the proportion of the C=O bond present in the first surface region is 0.85 or less.

4. The supported resin substrate according to claim 1, wherein the metal oxide comprises at least one selected from the group consisting of indium zinc oxide, zinc oxide, and aluminum oxide.

5. The supported resin substrate according to claim 1, wherein the release layer containing the metal oxide is in an oxygen deficient state.

6. A method for producing a supported resin substrate, the method comprising:
preparing a supporting substrate;
forming a release layer on the supporting substrate, the release layer containing a metal oxide; and
applying a resin material onto the release layer to form a resin substrate including a first surface region opposite the release layer and a second surface region in contact with the release layer,
wherein the resin material has a C=O bond, and
a proportion of the C=O bond in the second surface region of the resin substrate is lower than a proportion of the C=O bond present in the first surface region of the resin substrate.

7. The method according to claim 6, wherein a ratio of the proportion of the C=O bond present in the second surface region to the proportion of the C=O bond present in the first surface region is 0.95 or less.

8. The method according to claim 7, wherein the ratio of the proportion of the C=O bond present in the second surface region to the proportion of the C=O bond present in the first surface region is 0.85 or less.

9. The method according to claim 6, wherein the metal oxide comprises at least one selected from the group consisting of indium zinc oxide, zinc oxide, and aluminum oxide.

10. The method according to claim 6, wherein the release layer containing the metal oxide is formed in an inert gas or a reducing gas.

11. A method for producing an electronic device, the method comprising:
preparing a supporting substrate;
forming a release layer on the supporting substrate, the release layer containing a metal oxide;
applying a resin material onto the release layer to form a resin substrate including a first surface region opposite the release layer and a second surface region in contact with the release layer;
forming an electronic element on the resin substrate; and
mechanically peeling the resin substrate on which the electronic element is formed from the release layer formed on the supporting substrate,
wherein the resin material has a C=O bond, and
a proportion of the C=O bond in the second surface region of the resin substrate is lower than a proportion of the C=O bond present in the first surface region of the resin substrate.

12. An electronic device comprising:
a resin substrate including a first surface region and a second surface region opposite the first surface region; and
an electronic element in contact with the first surface region of the resin substrate,
wherein the resin substrate consists essentially of a resin material having a C=O bond, and
a proportion of the C=O bond present in the second surface region of the resin substrate is lower than a proportion of the C=O bond present in the first surface region of the resin substrate.

13. The electronic device according to claim 12, wherein a ratio of the proportion of the C=O bond present in ire the second surface region to the proportion of the C=O bond present in the first surface region is 0.95 or less.

14. The electronic device according to claim 13, wherein the ratio of the proportion of the C=O bond present in the second surface region to the proportion of the C=O bond present in the first surface region is 0.85 or less.

15. The electronic device according to claim 12, wherein the electronic element is an organic electroluminescent element.

16. The supported resin substrate according to claim 1, wherein the proportion of the C=O bond in the first surface region is defined by a ratio of an area of a spectrum derived from the C=O bond in the first surface region to an area of a C1s spectrum of the first surface region, the spectrum derived from the C=O bond in the first surface region and the C1s spectrum of the first surface region being measured by X-ray photoelectron spectroscopy, and the proportion of the C=O bond in the second surface region is defined by a ratio of an area of a spectrum derived from the C=O bond in the second surface region to an area of a C1s spectrum of the second surface region, the spectrum derived from the C=O bond in the second surface region and the C1s spectrum of the second surface region being measured by X-ray photoelectron spectroscopy.

* * * * *